United States Patent [19]
Sauvanet

[11] 3,995,176
[45] Nov. 30, 1976

[54] UNIDIRECTIONAL ALTERNATING CURRENT INTERRUPTER OPERABLE OVER FULL HALF CYCLES

[75] Inventor: Maurice M. Sauvanet, Fontenay-le-Fleury, France

[73] Assignee: Silec-Semi-Conducteurs, Paris, France

[22] Filed: Sept. 17, 1974

[21] Appl. No.: 506,813

[30] Foreign Application Priority Data
Sept. 17, 1973 France .................. 73.33255

[52] U.S. Cl. ................. 307/252 N; 307/252 D; 307/252 T; 307/252 UA; 307/252 B
[51] Int. Cl.² .................. H03K 17/68; H03K 17/72
[58] Field of Search ........ 307/252 B, 252 D, 252 N, 307/252 Q, 252 T, 305; 317/141 S; 323/22 SC, 24

[56] References Cited
UNITED STATES PATENTS

| | | | |
|---|---|---|---|
| 3,221,183 | 11/1965 | White | 307/252 T |
| 3,257,566 | 6/1966 | White | 307/252 T |
| 3,515,902 | 6/1970 | Howell | 307/252 T |
| 3,619,656 | 11/1971 | Domke | 307/252 T X |
| 3,644,754 | 2/1972 | Dosch et al. | 307/252 N |
| 3,665,212 | 5/1972 | Roberts et al. | 307/252 T |
| R26,119 | 12/1966 | Slater | 307/252 T X |

FOREIGN PATENTS OR APPLICATIONS
| | | | |
|---|---|---|---|
| 1,429,127 | 1/1966 | France | 307/252 T |

*Primary Examiner*—John S. Heyman
*Assistant Examiner*—Larry N. Anagnos
*Attorney, Agent, or Firm*—Sughrue, Rothwell, Mion, Zinn and Macpeak

[57] ABSTRACT

A unidirectional alternating current interrupter operable over full half cycles controls the passage of positive half cycles of a supply voltage $V_A$ into a load 2 disposed in series with a gate junction thyristor 10, a capacitor 13, an N-resistor 12 and a diode 11 are arranged at the terminals of the supply voltage. In this way, during negative half cycles, the capacitor 13 is charged and the gate junction thyristor 10 is rendered conducting from the beginning of the subsequent positive half cycle. To prevent energization of the gate junction thyristor 10 at the end of a negative half cycle, a controlled interrupter is arranged in parallel with the capacitor 13. When this interrupter 15 is closed, the gate junction thyristor 10 cannot be rendered conducting.

6 Claims, 5 Drawing Figures

UNIDIRECTIONAL ALTERNATING CURRENT INTERRUPTER OPERABLE OVER FULL HALF CYCLES

BACKGROUND OF THE INVENTION

1. Field of the Invention

The present invention relates to a unidirectional alternating current interrupter operable over full half cycles which is particularly adapted for use in a control device operable over full cycles.

2. Description of the Prior Art

The devices known in the prior art for controlling the flow of current into a load connected at the terminals of a circuit supplied with alternating current consist essentially of two interrupter circuits. In the case of the known arrangements, the first circuit comprises a thyristor which may be triggered by an external control signal to allow the passage of a half cycle having a first polarity and the second circuit operates automatically allowing the following half cycle of opposite polarity to flow after the first circuit has allowed through a first half cycle. In the case of these prior art devices, the arrangements for obtaining triggering of the first circuit at the passage to zero of a half cycle are generally very complicated and often inefficient.

SUMMARY OF THE INVENTION

Accordingly, it is an object of the present invention to provide a first device which allows the passage of full half cycles of a given polarity and which is simple and inexpensive.

A further object of the present invention is the use of the abovementioned first device in a control device operable over full cycles.

The interrupter according to the invention which is designed to achieve these objects is a unidirectional alternating current interrupter operable over full half cycles and comprising a semi-conductor means with unilateral conduction from a first to a second main electrode and comprising a control electrode adapted to be triggered when the potential of this control electrode is of opposite polarity to that of the first main electrode with respect to that of the second main electrode such that the control voltage for the control electrode is obtained and retained in a memory during the half cycle of opposite polarity to the half cycle which the semi-conductor means must let through.

The semi-conductor means in question may be a gate junction thyristor, the gate circuit of this thyristor comprising, in particular, a capacitor charged by the negative half cycles of the supply voltage as a result of which this thyristor is triggered at the very beginning of the following positive half cycle. This capacitor can thus be considered as a memory means.

BRIEF DESCRIPTION OF THE DRAWINGS

Other features according to the present invention will be described in further detail in the following description provided with reference to the accompanying drawings, in which.

DESCRIPTION OF THE PREFERRED EMBODIMENT

Figure 1:
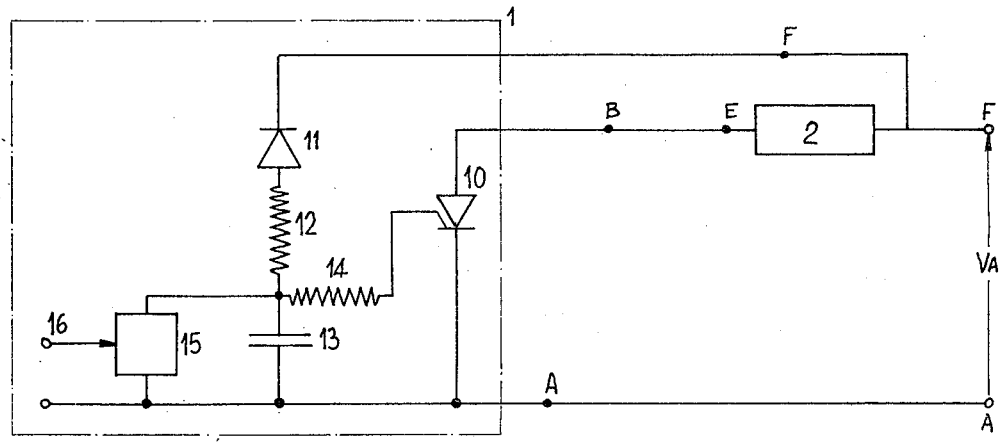
FIG. 1 shows an embodiment of a unidirectional alternating current interrupter operable over full half cycles according to the invention.

With reference to FIG. 1, the unidirectional alternating current interrupter operable over full half cycles is represented by reference number 1. In this embodiment, the circuit 1 is designed to interrupt or allow the positive half cycles of an alternating voltage $V_A$ to pass into a load 2. The voltage $V_A$ is applied between the terminals F and A. The load 2 is connected between the terminals F and E and the circuit 1 is connected between the terminals F, B and A; the terminals B and E being interconnected. The circuit 1 comprises an N-gate junction thyristor 10, the anode of which is connected to the terminal B, and the cathode of which, to the terminal A. A diode 11, a resistor 12 and a capacitor 13 are connected in series between the terminals F and A, the conducting direction of the diode being such that it allows the current to pass from A to F. The gate of the junction thyristor is connected to the connection point of the resistor 12 and the capacitor 13 and a resistor 14 can be inserted between this connection point and the gate. A controlled interrupter circuit 15 is arranged in parallel with the capacitor 13 and comprises a control terminal 16. According to a preferred embodiment, the controlled interrupter 15 is a PNP transistor, the collector of which is connected to the junction between the resistor 12 and the capacitor 13 while its emitter is connected to the terminal A, the control voltage being applied to the base.

A gate junction thyristor is triggered when the voltage on its gate is of opposite polarity to that of its anode with respect to its cathode, that is, to trigger the N-gate junction thyristor 10 it is both necessary for the voltage of the anode to be positive with respect to the voltage of the cathode and for the voltage of the gate to be lower than the voltage of the cathode, that is, a current is removed from the gate. Thus, if at the beginning of a positive half cycle the capacitor has been previously charged during the preceding negative half cycle, the thyristor 10 is triggered. On the other hand, if the interrupter 15 has been closed during the negative half cycle, at the beginning of the following positive half cycle, the gate is at the same potential as the cathode and the thyristor 10 remains blocked. Irrespective of the instant at which the interrupter 15 closes, the thyristor 10 always commences to be conducting after the passage to zero of the voltage preceding the positive half cycle. In this preferred embodiment, N-gate junction thyristor is used, but it is obvious to the person skilled in the art that any other similar device, that is, a device triggerable by the removal of current on its control electrode may be used instead of this gate junction thyristor.

Figure 2:
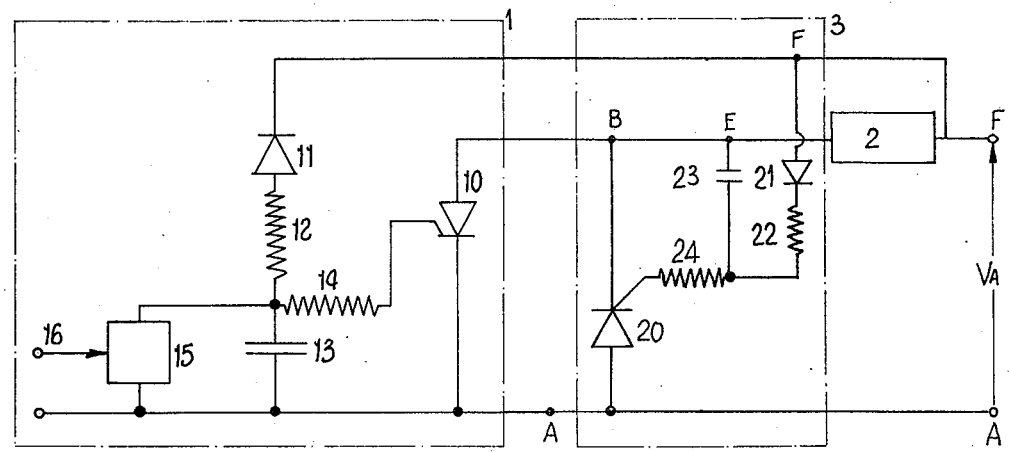
FIG. 2 shows a control device operable over full cycles comprising a device according to the present invention.

FIG. 2 shows a method of using a unidirectional alternating current interrupter operable over full half cycles to obtain a control device operable over whole cycles. The circuit represented in FIG. 2 is formed by superposing the circuit of FIG. 1 and a circuit 3. The circuit 3 comprises a P- gate junction thyristor 20 having its cathode connected to the terminal B and its anode connected to the terminal A. Its gate is connected to the terminal F by way of a circuit comprising a diode 21, the anode of which is connected to the terminal F and a resistor 22 and possibly a resistor 24. The point of connection between the resistors 22 and 24 is connected to the terminal E by way of a capacitor 23. In this circuit, as in the preceding one, the terminals B and E are interconnected. Thus, while the circuit 1 allows a full positive half cycle to pass into the load 2, the capacitor 23 is charged through the diode 21 and the resistor 22. The discharging of the capacitor 23 at the commencement of the following negative half cycle into the gate of the thyristor 20 energizes the same and maintains the potential on the load during the following negative half cycle. This process will be repeated as long as the controlled interrupter 15 is open. Thus the interrupter consisting of the two circuits 1 and 3 is always conducting or non-conducting for two full consecutive half cycles; a positive and a negative half cycle.

Hitherto, the assembly of the circuits 1 and 3 has been considered as an interrupter arranged in series with the load 2. However, when it is wished to increase the potential on the load, it is possible to use an interrupter of greater capacity, for example, a triac. In this case, assembly consisting of the circuits 1 and 3 constitutes for this triac a triggering circuit operable over a full cycle.

Figure 3:
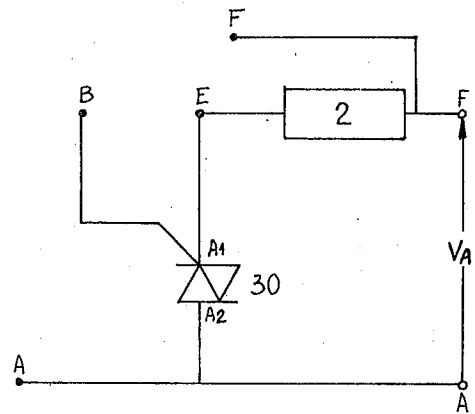
FIG. 3 shows the method of connecting a main interrupter when the interrupter according to the present invention is used as a control device.

FIG. 3 represents the method of connecting the triac. When the circuits 1 and 3 are connected to the terminals A, B, E and F as shown in FIG. 2, the connection between the terminals B and E is eliminated. The terminals $A_1$ and $A_2$ of the triac are connected to the terminals E and A respectively while its gate is connected to the terminal B. The use of a triac as a potential interrupter is provided in this instance purely by way of example. Other controlled bi-directional power interrupters can also be used.

Figure 4:
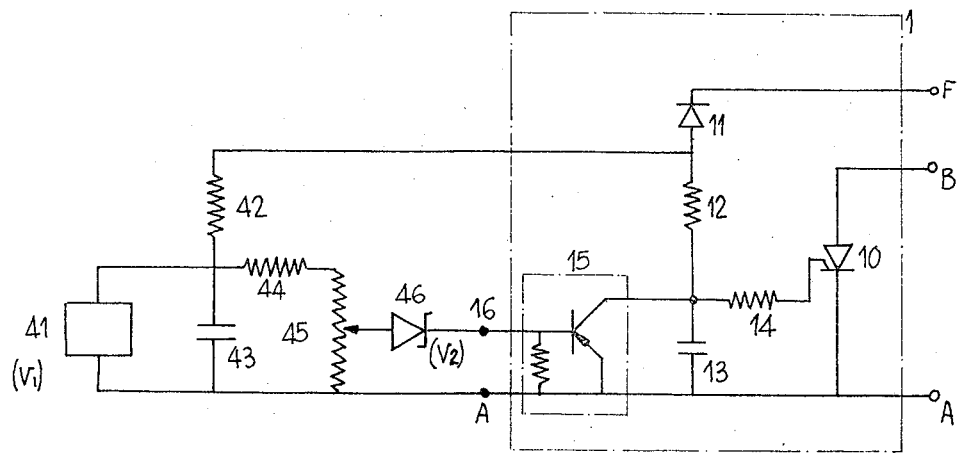
FIGS. 4 and 5 represent two embodiments of the potential varying element operable over a series of cycles according to the present invention.

With reference to FIG. 4, a method of automatically controlling the unidirectional alternating current interrupter operable over full half cycles according to the invention will now be described. When a device 3 such as described in reference to FIG. 2 is used in association with the device 1 according to the present invention, a potential varying device operable over a series of cycles is obtained. In the embodiment according to FIG. 4, a resistor 42 and a capacitor 43 are connected in parallel with the resistor 12 and the capacitor 13. A device known as a trigger 41 which has the property of being conducting when a greater voltage than the given value $v_1$ is applied to its terminals is connected to the terminals of the capacitor 43. A resistor 44 and a potentiometer 45 which are arranged in series are also connected in parallel with the capacitor 43. The wiper arm of the potentiometer is connected to the terminal 16 through a diode 46 having a Zener voltage $v_2$. For example, the trigger 41 may be a diac.

A staircase voltage which drops rapidly when the threshold $v_1$ of the trigger is reached is then produced at the terminals of the capacitor 43. The constant frequency repeated staircase voltage thus obtained is applied to the terminals of the circuit 1 by way of the regulating potentiometer 45 and the Zener diode 46 (the Zener diode may be replaced by any other threshold device), and the Zener diode is in the conducting state when the voltage at its terminals is greater than its Zener voltage $v_2$. Thus, when a voltage $V_A$ is applied to the device, after the first negative half cycle, the N-gate junction thyristor 10 is rendered conducting for successive positive half cycles. After a given number of half cycles, the capacitor 43 has been sufficiently charged to trigger the Zener diode 46 and the thyristor 10 is blocked by way of the controlled interrupter 15. This blocking action is continued until the charge of the capacitor 43 reaches a value corresponding to the threshold of the trigger 41. By modifying the regulation of the potentiometer 45, the triggering threshold of the trigger 41 and the charging time constant of the capacitor 43 by the resistor 42, it is possible to determine the number of full half cycles passing through and the number of full half cycles which are blocked.

Figure 5:
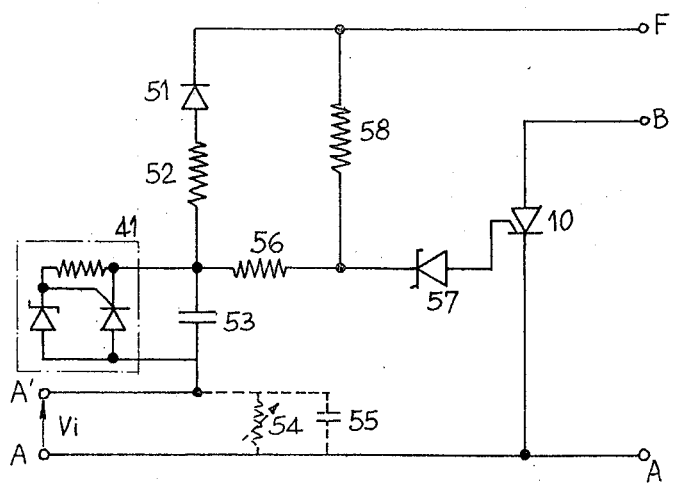

FIG. 5 represents another embodiment of the device shown in FIG. 4 in which the circuit 1 according to the present invention is combined with its control device. The N- gate junction thyristor 10 is placed between the terminals B and A. The terminals F and A are connected through the intermediary of a diode 51, a resistor 52, a capacitor 53 and a voltage source ($V_i$) inserted between the terminals A' and A. A trigger device 41 is arranged in parallel with the capacitor 53 and the diode 51 is polarized to allow a current to pass from A to F.

The gate of the N- gate junction thyristor 10 is connected to the junction of the resistor 52 and the capacitor 53 by way of a resistor 56 and a Zener diode 57. In addition, a resistor 58 is connected between the terminal F and the connection point of said resistor 56 and said Zener diode 57.

Thus, the capacitor 53 is negatively charged in stages until reaching the triggering threshold of the trigger. In this way, staircase voltages are obtained having $n$ network cycles ($n$ being determined by the charging constant of the capacitor 53 and by the triggering voltage of the trigger). The Zener diode 57 (which may be replaced by any other threshold device) has a threshold voltage $v_3$. In this way, a discharge current from the capacitor 53 flowing by way of the Zener diode 57 and the gate of the thyristor 10 can only flow if a negative voltage $V_i$ is applied between A' and A. By increasing this voltage $V_i$ the gate junction thyristor 10 will be energized at the beginning of the positive half cycle numbered $p$ following the commencement of charging the capacitor 53, as well as at the beginning of the following $n - p$ positive half cycles. The role of the resistor 58 is to prevent energization of the thyristor 10 during a positive half cycle, this resistor serving to accentuate the staircase voltage troughs by superposing thereon an undulatory voltage which reduces the absolute value of the negative voltage on the gate of the thyristor 10 during the positive half cycles. Regulation of the number $n - p$ of passing half cycles may be effected manually. To do this, the control voltage $V_i$ may be replaced by a variable resistor 54 decoupled by a capacitor 55. Regulation of the numbers $n$ and $p$ may also be effected by varying the threshold of the Zener diode 57 or the trigger 41 or by varying the resistors 52 or 54 or even by regulating the amplitude of the staircase voltage applied to the Zener diode 57.

The present invention is obviously not limited to the embodiments which have been described and it will be apparent to the person skilled in the art that variants and modifications are possible without departing from the scope of the present invention.

What is claimed is:

1. A unidirectional alternating switching circuit operable over full half cycles comprising:

a junction N- gate thyristor having an anode, a cathode and a control electrode, said anode and cathode adapted to be serially connected with a load and supply circuit;

a memory means adapted to be connected across said supply circuit for storing a voltage during negative half cycles of the supply circuit voltage and triggering said junction N- gate thyristor during the following positive half cycles commencing with the zero crossing of the supply circuit voltage, said memory means comprising the series connection of a capacitor, a first resistor and a diode, respectively, said capacitor being connected to the cathode of said junction N- gate thyristor and said diode being polarized in the opposite direction to said junction N- gate thyristor; and a second resistor connected between the junction of said capacitor with said first resistor and the control electrode of said junction N- gate thyristor.

2. A switching circuit as claimed in claim 1, further comprising a controlled switch connected in parallel with said capacitor as a result of which the junction N- gate thyristor allows positive half cycles to pass into said supply and load circuit when said controlled switch is open and blocks these half cycles when said controlled switch is closed.

3. A unidirectional alternating switching circuit operable over full cycles comprising:

a junction N- gate thyristor having an anode, a cathode and a control electrode, said anode and cathode adapted to be serially connected with a load and supply circuit;

a memory means adapted to be connected across said supply circuit for supplying a voltage during negative half cycles of the supply circuit voltage and triggering said junction N- gate thyristor during the following positive half cycles commencing with the zero crossing of the supply circuit voltage, said memory means comprising the series connection of a capacitor, a first resistor and a diode, respectively, said capacitor being connected to the cathode of said junction gate thyristor and said diode being polarized in the opposite direction to said junction N- gate thyristor;

a second resistor connected between the junction of said capacitor with said first resistor and the control electrode of said junction N- gate thyristor;

a junction P- gate thyristor having an anode, a cathode and a control electrode, said anode and cathode being connected to the cathode and anode, respectively, of said junction N- gate thyristor; and means connected to the control electrode of said junction P- gate thyristor responsive to the conduction of said junction N- gate thyristor for triggering said junction P- gate thyristor during the following negative half cycles after the conduction of said junction N- gate thyristor commencing with the zero crossing of the supply circuit voltage.

4. A switching circuit as claimed in claim 3, further comprising a controlled switch connected in parallel with said capacitor as a result of which the junction N- gate thyristor allows positive half cycles to pass into said supply and load circuit when said control switch is opened and blocks these half cycles when said control switch is closed.

5. A power varying circuit operable over series of full cycles, characterized in that it comprises a switching circuit according to claim 4, further comprising a ramp voltage generating means connected in parallel with said capacitor and said first resistor for generating a repeating ramp voltage having a predetermined repetition frequency; and a threshold device connected between said ramp voltage generating means and said controlled switch for providing a control voltage having an adjustable threshold to said controlled switch.

6. A power varying circuit operable over series of full cycles, characterized in that it comprises a switching circuit according to claim 3, further comprising trigger means connected in parallel with said capacitor for generating a ramp voltage as a function of the charge of said capacitor, said ramp voltage having a predetermined repetition frequency determined by the threshold of said trigger means; and a threshold device connected between said second resistor and the control electrode of said junction N- gate thyristor.

* * * * *